(12) United States Patent
Chau et al.

(10) Patent No.: US 9,258,013 B1
(45) Date of Patent: Feb. 9, 2016

(54) DATA COMPRESSION WITH HUFFMAN CODE ON MULTICORE PROCESSORS

(71) Applicants: Savio N. Chau, Cedar Rapids, IA (US); Ridwan Rashid, Cedar Rapids, IA (US)

(72) Inventors: Savio N. Chau, Cedar Rapids, IA (US); Ridwan Rashid, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/842,200

(22) Filed: Sep. 1, 2015

(51) Int. Cl.
*H03M 7/40* (2006.01)
*G06F 17/30* (2006.01)
*H03M 7/30* (2006.01)

(52) U.S. Cl.
CPC ............ *H03M 7/40* (2013.01); *G06F 17/30138* (2013.01); *H03M 7/30* (2013.01); *H03M 7/4006* (2013.01)

(58) Field of Classification Search
CPC ........ H03M 7/40; H03M 7/30; H03M 7/4006
USPC ....................................... 341/65, 50, 51, 107
See application file for complete search history.

(56) References Cited

U.S. PATENT DOCUMENTS

2005/0231401 A1* 10/2005 Perrone ................ H04N 1/4177 341/107

* cited by examiner

*Primary Examiner* — Joseph Lauture
(74) *Attorney, Agent, or Firm* — Angel N. Gerdzhikov; Donna P. Suchy; Daniel M. Barbieri (57) ABSTRACT

An encoding system analyzes a data file to determine if portions of the data file include significant disparities in symbol probability. Huffman coding trees are produced for each of the portions of the data file and the portions are separately encoded according to specific Huffman coding trees. Encoded portions and the corresponding Huffman coding tree are packaged together and transmitted to a decoder. The encoder and decoder processes portions using different Huffman coding trees in parallel via multiple processors or processing cores.

20 Claims, 9 Drawing Sheets

| | Processor 1 | | | | | Processor 2 | | | | | Processor 3 | | | | | Processor 4 | | | | |
|---|---|---|---|---|---|---|---|---|---|---|---|---|---|---|---|---|---|---|---|---|
| String | E | G | C | F | C | A | C | B | D | A | E | A | F | B | B | B | H | D | D | A |
| Code | 01 | 001 | 1 | 000 | 1 | 1 | 000 | 01 | 001 | 1 | 000 | 01 | 000 | 1 | 1 | 000 | 001 | 1 | 1 | 01 |
| Length | 2 | 3 | 1 | 3 | 1 | 1 | 3 | 2 | 3 | 1 | 3 | 2 | 3 | 1 | 1 | 3 | 3 | 1 | 1 | 2 |

DATA COMPRESSION WITH HUFFMAN CODE ON MULTICORE PROCESSORS

BACKGROUND

Probability coding is a technique for lossless data compression in data files. Huffman codes are one of the most popular probability codes, in which a set of symbols is ranked by their probability of occurrence. More frequently occurring symbols are assigned shorter code words, and less frequently occurring symbols are assigned longer code words.

Symbol distribution often includes local clusters of symbols that controvert the global symbol distribution. Further, modern computers include multiple processors or processors with multiple cores. These features are generally not exploited in Huffman codes.

Consequently, it would be advantageous if an apparatus existed that is suitable for producing and processing probability encoded signals to exploit local symbol clustering and multiple parallel processors.

SUMMARY

Accordingly, embodiments of the inventive concepts disclosed herein are directed to a method and apparatus for producing and processing probability encoded signals to exploit local symbol clustering and multiple parallel processors.

In one aspect, embodiments of the inventive concepts disclosed herein are directed to an encoding system analyzes a data file to determine if portions of the data file include significant disparities in symbol probability. Huffman coding trees are produced for each of the portions of the data file and the portions are separately encoded according to specific Huffman coding trees. Encoded portions and the corresponding Huffman coding tree are packaged together and transmitted to a decoder. The encoder and decoder may processes portions using different Huffman coding trees in parallel via multiple processors or processing cores.

It is to be understood that both the foregoing general description and the following detailed description are exemplary and explanatory only and should not restrict the scope of the claims. The accompanying drawings, which are incorporated in and constitute a part of the specification, illustrate embodiments of the inventive concepts disclosed and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Reference will now be made in detail to the inventive concepts disclosed herein, exemplary embodiments of which are illustrated in the accompanying drawings. The scope of the inventive concepts disclosed herein is limited only by the claims; numerous alternatives, modifications and equivalents are encompassed. For the purpose of clarity, technical material that is known in the technical fields related to the embodiments has not been described in detail to avoid unnecessarily obscuring the description.

Text and symbols in a data file tend to have local clusters or concentrations. During probability encoding, such as with a Huffman code, a data file may be parsed into blocks based on the local concentrations and a separate encoding table determined for each block based on the particular symbol probabilities of the block.

Huffman coding is more efficient if the probability of occurrence of symbols has a large disparity. For example, a Huffman code produces a more compact compressed file if $P(A)=0.6$, $P(B)=0.2$, $P(C)=0.15$, $P(D)=0.05$ as compared to the distribution of $P(A)=0.3$, $P(B)=0.25$, $P(C)=0.23$, $P(D)=0.22$, where $P(A)$ is the probability of A etc. Code word lengths in both cases will be the same, but the occurrence of longer code words (i.e., D) in the first case is less probable than the second case, and the first case has more short codes (i.e., A) than the second case. Therefore, if the file is partitioned in such a way that each block has a higher concentration of a small subset of the symbols, then the Huffman encoding of each block can generate a more compact file.

Figure 1:
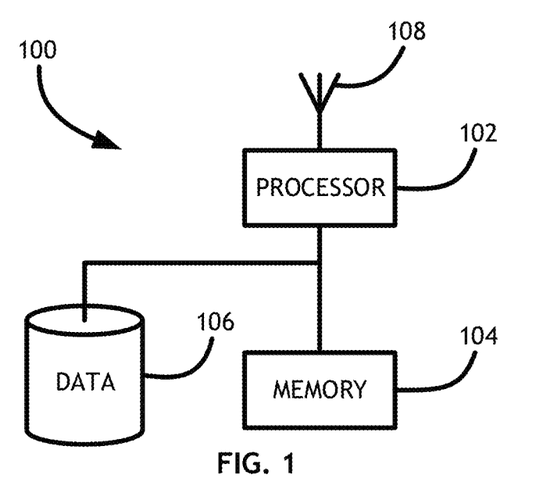
FIG. 1 is a block diagram of a computer system suitable for implementing embodiments of the inventive concepts disclosed herein.

Referring to FIG. 1, a block diagram for a computer system 100 suitable for implementing embodiments of the inventive concepts disclosed herein is shown. The computer system 100 includes a processor 102, a memory 104, a data storage element 106, and a communication element 108.

The processor 102 may be configured for encoding and decoding probability encoded data files. The processor 102 may comprise a system of multiple, connected processors, or a processor 102 having multiple processing cores. The processor 102 is connected to a memory 104 for storing and executing processor executable code as more fully described herein.

The memory 104 may be implemented as a non-transitory processor-readable medium configured to store data and/or processor-executable code.

The data storage element 106 may be coupled with the processor 102 and may store data files during probability encoding and compression.

The communication element 108 is coupled with the processor 102 and may be implemented as an antenna configured for sending and receiving probability encoded data files.

Figure 2A:
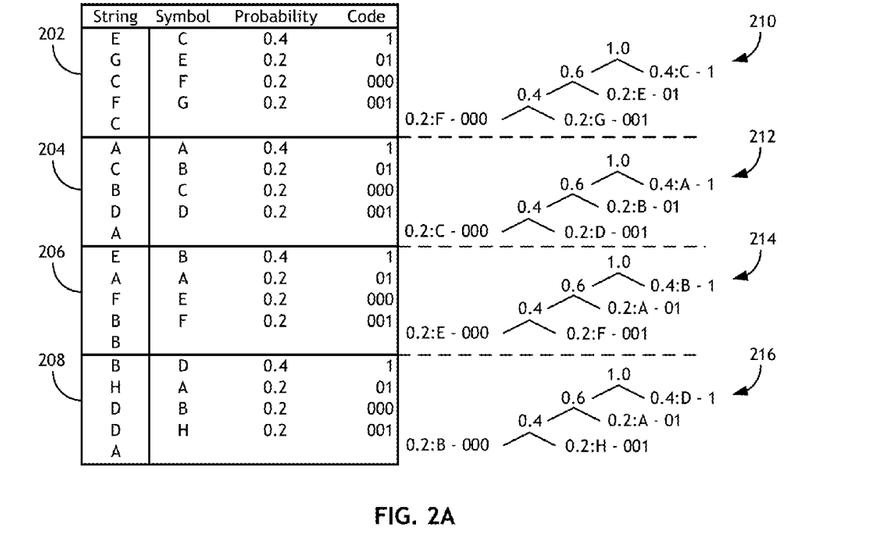
FIG. 2A is a representation of an exemplary encoding data structure according to one embodiment of the inventive concepts disclosed herein.

Referring to FIG. 2A, a representation of an exemplary encoding data structure according to one embodiment of the inventive concepts disclosed herein is shown. For a particular data file or character string, the string may be broken into blocks 202, 204, 206, 208. In one embodiment, the blocks 202, 204, 206, 208 may be a predefined size but a more advantageous variable block 202, 204, 206, 208 size embodiment is described herein.

Each block 202, 204, 206, 208 may include symbols having disparate frequencies of occurrence such that probability based encoding may produce a substantial decrease in data size. Each block 202, 204, 206, 208 may have different symbol frequency disparities such that a different encoding architecture is required to realize the decrease in data size. For example, in a first block 202, the symbol "C" may occur with twice the frequency of any other symbol. A Huffman coding tree 210 may encode the symbol "C" to a logical "1" (the shortest possible code word) while all other symbols are given longer code words according to their frequency. Less frequent symbols in a Huffman code have long code words. The length of these code words depends on the depth of the Huffman coding tree 210, 212, 214, 216 corresponding to a coding table. The length of the least probable symbols is equal to N−1 bits, where N is the number of levels in the Huffman coding tree. In the present case, all symbols other than "C" have the same frequency, but a person skilled in the art will appreciate that the similarity of frequency is an aberration due to the small size of the example shown.

In a second block 204, the symbol "A" may occur with twice the frequency of any other symbol. A Huffman coding tree 212 may encode the symbol "A" to a logical "1" (the shortest possible code word) while all other symbols are given longer code words according to their frequency. A single Huffman code cannot encode both symbol "C" and symbol "A" as the same code word; therefore encoding the first block 202 and the second block 204 requires a first Huffman coding tree 210 associated with the first block 200 and a second Huffman coding tree 212 associated with the second block 204.

Likewise, a third block 206 and fourth block 208 may each have their own symbol frequency disparities necessitating a third Huffman coding tree 214 and fourth Huffman coding tree 216 respectively. Many code words are reused by different Huffman coding trees 210, 212, 214, 216 for different symbols. In order to associate the correct code words with the correct symbols for each block 202, 204, 206, 208, the Huffman coding tree 210, 212, 214, 216 has to be sent to the decoder in advance. While the additional Huffman coding trees 210, 212, 214, 216 represent additional overhead, each Huffman coding tree 210, 212, 214, 216 has to be sent to the decoder only once. For a large file, if the symbols are not too randomly distributed, the additional overhead is relatively small.

If encoding is performed with multiple processors or processor cores, the Huffman coding tree 210, 212, 214, 216 in each processor or processor core may be shallower, and thus long code words can be shortened.

Figure 2B:
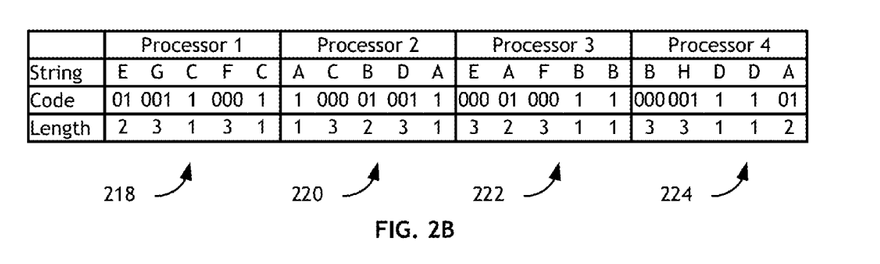
FIG. 2B is a representation of an exemplary encoded data file according to one embodiment of the inventive concepts disclosed herein.

Referring to FIG. 22B, a representation of an exemplary encoded data file according to one embodiment of the inventive concepts disclosed herein is shown. The encoded data file may comprise a plurality of encoded blocks 218, 220, 222, 224, each encoded by a different processor or processor core. Each encoded block 218, 220, 222, 224 may comprise identical code words that correspond to different decoded symbols according to different Huffman coding trees. The overall length of the encoded data file is less than if the data file had been encoded with a single Huffman coding tree.

Figure 3A:
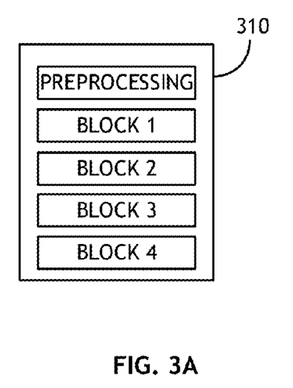
FIG. 3A is a block diagram of a single processor and data distribution corresponding to one embodiment of the inventive concepts disclosed herein.

Referring to FIG. 3A, a block diagram of a single processor 310 and data distribution corresponding to one embodiment of the inventive concepts disclosed herein is shown. A single processor 310 configured to encode a data file preprocesses the data file, as more fully described herein, to determine a plurality of blocks having local symbol frequencies. The single processor 310 parses the data file into blocks according to the local symbol frequencies and then encodes each block according to an associated Huffman coding tree.

Figure 3B:
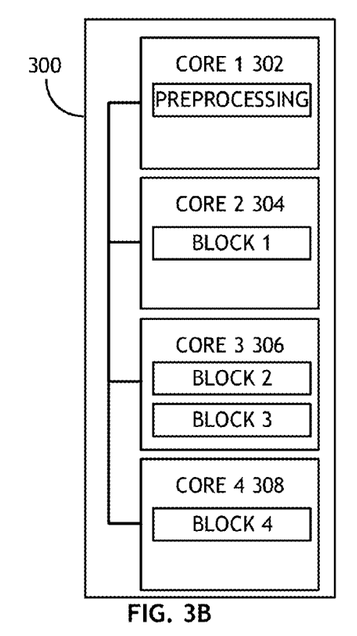
FIG. 3B is a block diagram of a multi-core processor and data distribution corresponding to one embodiment of the inventive concepts disclosed herein.

Referring to FIG. 3B, a block diagram of a multi-core processor 300 and data distribution corresponding to one embodiment of the inventive concepts disclosed herein is shown. During encoding, a first core 302 in the multi-core processor 300 may perform preprocessing on a data file to determine a plurality of blocks having local symbol frequencies and Huffman coding trees corresponding to each block. Each Huffman coding tree and corresponding block is sent to a core 302, 304, 306, 308 in a multi-core processor 300. Each core 302, 304, 306, 308 processes a block in parallel with the other cores 302, 304, 306, 308. Each core 302, 304, 306, 308 may use a block table to record the locations and lengths of its own blocks.

During decoding, the first core 302 may parse an encoded data file according to block delineations corresponding to different Huffman coding trees associated with each block. Huffman coding trees should have the same depth for all blocks so that the cores 302, 304, 306, 308 can locate the beginning of the encoded symbols easily. If the blocks are stored consecutively in a memory, only the address of the first block and the lengths of the subsequent blocks are needed, reducing the size of the block table.

In one embodiment, the multi-core processor 300 may utilize a separate output data bus from each core 302, 304, 306, 308 to a decoding processor. Data from different cores 302, 304, 306, 308 of the multi-core processor 300 can be distinguished by the port number in the decoding processor. However, many multi-core processors 300 may not have a separate output data bus for each core 302, 304, 306, 308. Therefore, some or all the cores 302, 304, 306, 308 may have to share a common data bus to the decoding processor.

Figure 3C:
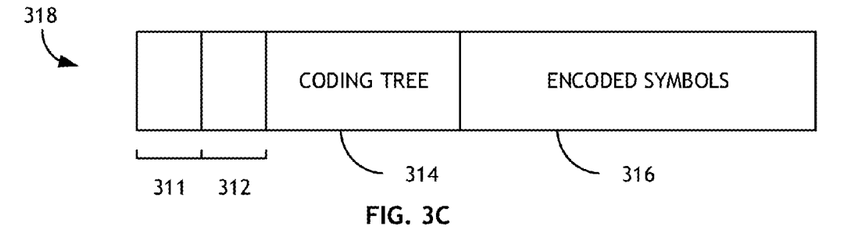
FIG. 3C is a data structure for a signal encoded according to one embodiment of the inventive concepts disclosed herein.

Referring to FIG. 3C, a data structure for a signal encoded according to one embodiment of the inventive concepts disclosed herein is shown. In at least one embodiment, a data file is preprocessed to be split into blocks 318 that maximize local concentrations of symbols in each block 318 as described herein. The blocks 318 are assigned to individual processors or cores in a multi-core processor, potentially with several blocks 318 assigned to one processor. It may be necessary to separate the dictionary (a structure associating keyword with shorter symbol representations), Huffman coding tree 314, and the encoded symbols 316 in each block 318. Because each processor can have multiple blocks 318 and the block sizes are variable, when they are stored in the memory, the blocks 318 must be uniquely identifiable. If the cores in a multi-core processor share a common output bus, the output data from the different cores also must be uniquely identifiable. To satisfy these requirements, each block 318 may comprise a particular data structure having control bits 311, 312, a Huffman coding tree 314, and corresponding encoded symbols 316. In one embodiment, a first control bit 311 and second control bit 312 may indicate one of three possible encoding structures:

1) Encoded symbols are literals; a Huffman coding tree is included for decoding the symbols but no dictionary is necessary.
2) Encoded symbols are literals and keywords; in addition to the Huffman coding tree, a dictionary is needed to decode the keywords. Because the dictionary is used by all the blocks, it may be sent once and stored by the decoding processor in memory.
3) Encoded symbols and repeated string/distance output compressed by a Huffman code; no dictionary is necessary. The original text string can be derived from the content of the encoded symbols. There are two Huffman coding trees, one for literals and length and one for distance.

Figure 4:
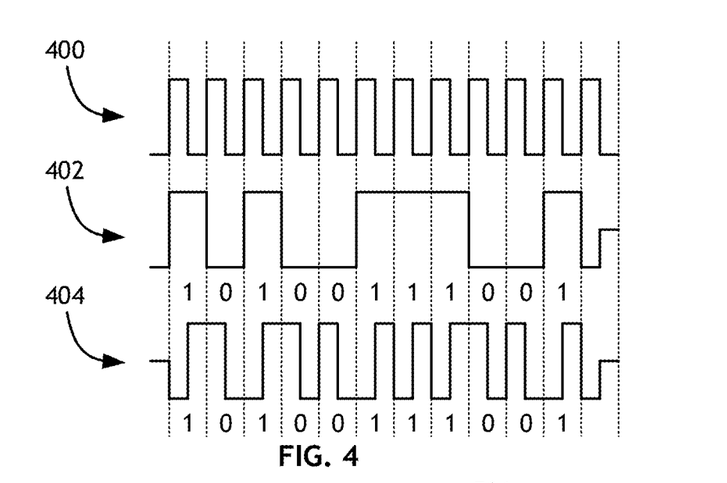
FIG. 4 is a representation of signals for decoding a data signal.

Referring to FIG. 4, a representation of signals for decoding a data signal is shown. In one embodiment, where a data stream has been encoded according to a plurality of different Huffman code trees based on localized symbol frequencies, a processor is instructed to switch Huffman coding trees for decoding by counting the number of decoded symbols using the current Huffman coding tree and relating the number of decoded symbols to a quota included in the encoded string 402. The processor switches to a new Huffman coding tree when the quota is reached. Such embodiment reduces the number of bits necessary for decoding.

In another embodiment, an encoded string 402 may use Manchester coding to signal the switching of decoding tables. Where an encoded string 402 is encoded by a Manchester code 404, each data bit is represented by a signal transition rather than a signal level. In each clock cycle 400, a transition of signal from low to high represents a logical 1, and a transition of signal from high to low represents a logical 0.

Figure 5:
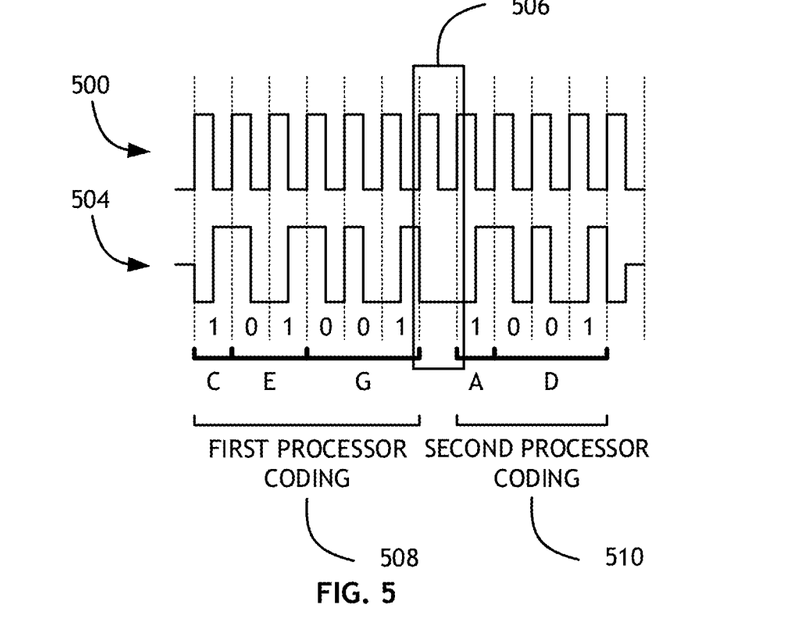
FIG. 5 is a representation of signals for decoding a data signal in a multi-processor environment according to one embodiment of the inventive concepts disclosed herein.

Referring to FIG. 5, a representation of signals for decoding a data signal in a multi-processor environment according to one embodiment of the inventive concepts disclosed herein is shown. Where a signal is encoded by a Manchester code 504, the switching signal 506 of a Huffman coding tree may be signified by a clock cycle 500 without signal transition. A first block 508 may be directed toward a first processor for coding or decoding as necessary, and a second block 510 may be sent to a second processor for coding or decoding in parallel with the first block 508. In this embodiment, encoded data may be stored in a buffer for processing. When the decoder detects the switching signal 506, it stores the encoded data in a buffer associated with a particular Huffman coding tree.

Figure 6:
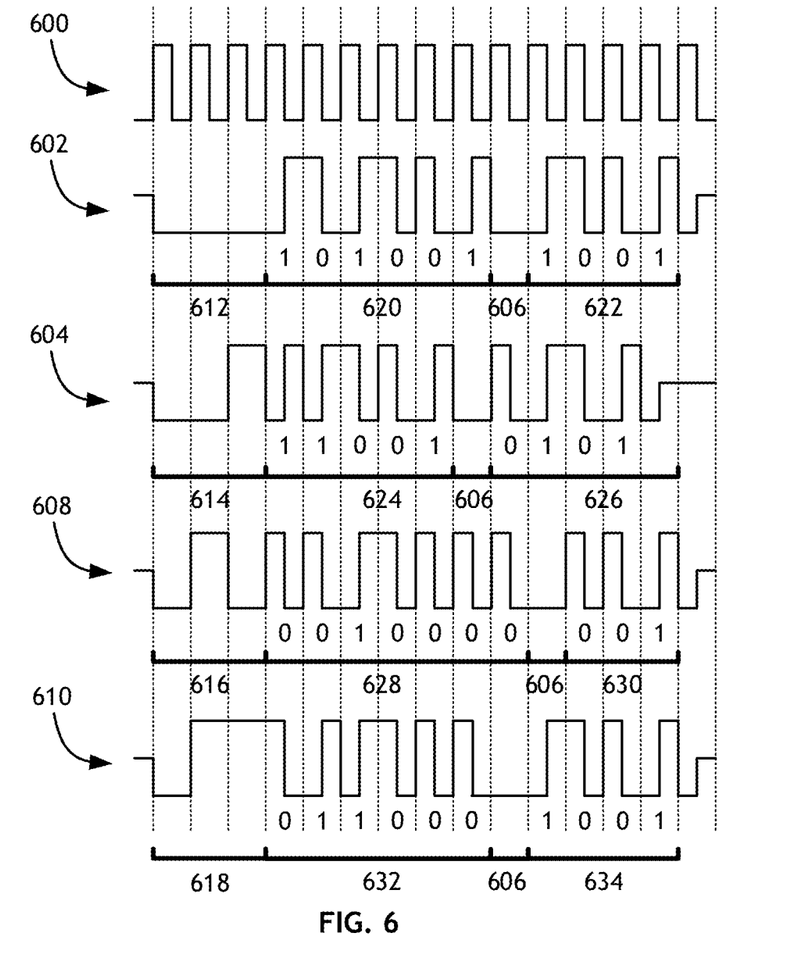
FIG. 6 is a representation of signals for decoding a data signal in a multi-processor environment according to one embodiment of the inventive concepts disclosed herein.

Referring to FIG. 6, a representation of signals for decoding a data signal in a multi-processor environment according to one embodiment of the inventive concepts of the present disclosure is shown. The present representation includes a clock signal 600, a first Manchester code signal 602 embodying a Huffman encoded block, a second Manchester code signal 604 embodying a Huffman encoded block, a third Manchester code signal 608 embodying a Huffman encoded block, and a fourth Manchester code signal 610 embodying a Huffman encoded block.

There are two ways to distinguish data from different cores; by byte counting or by Manchester code. Because blocks 620, 622, 624, 626, 628, 630, 632, 634 may vary in size, byte counting may be suboptimal.

In some embodiments of the inventive concepts of the present disclosure, it is assumed that each core sends out the compressed data in a round robin order; therefore, a Manchester code with a simple switching signal 606 such as a clock cycle 600 without signal level transition is sufficient. Because each core can service multiple blocks 620, 622, 624, 626, 628, 630, 632, 634, and the processors can also finish encoding out of order due to variable block size, a processor ID 612, 614, 616, 618 may distinguish data from different processors in addition to the switching signal 606 distinguishing blocks from the same core.

In one embodiment, for a few clock cycles 600 immediately after the start of transmission, non-return to zero bits are used to represent the processor IDs 612, 614, 616, 618. Unlike normal Manchester bits, which transition from high level to low level for 0 and low level to high level for 1 within a clock cycle 600, the non-return to zero bits do not transition throughout the clock cycle 600; a high level represents a 1 and low level represents a 0. Once a processor has started sending output data, it can separate the blocks 620, 622, 624, 626, 628, 630, 632, 634 by using a conventional Manchester switching signal 606.

Figure 7:
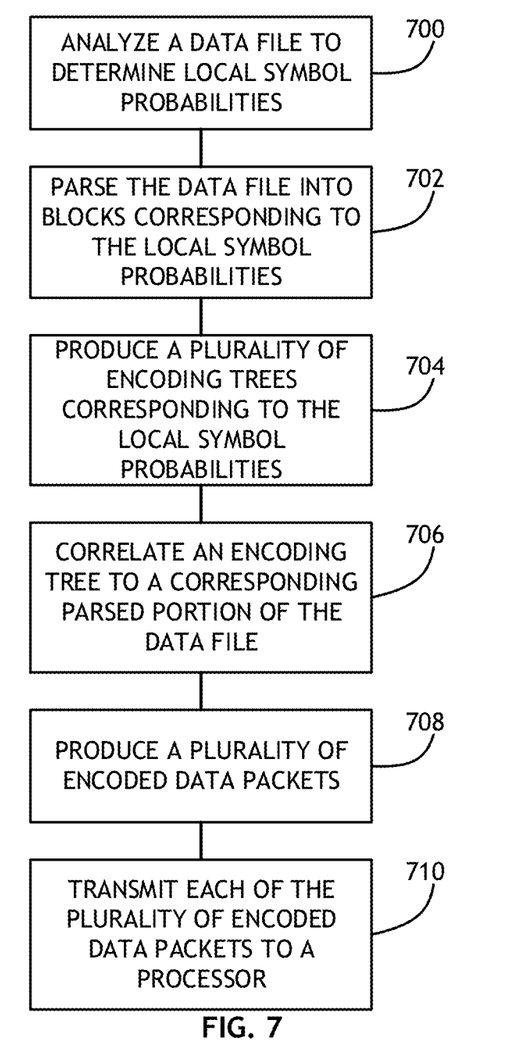
FIG. 7 is a flowchart of a method for encoding a data file according to one embodiment of the inventive concepts disclosed herein.

Referring to FIG. 7, a flowchart of a method for encoding a data file according to one embodiment of the inventive concepts disclosed herein is shown. An encoder analyzes 700 a data file to determine local symbol probabilities. Local symbol probabilities are identified by the variations in symbol frequency, if a symbol is highly concentrated in a block, that symbol's frequency will be much higher than other symbols. Using predetermined block sizes, a portion of a file with local concentrations of symbols may be divided into separate blocks, lowering the local probability of those symbols in each block. Likewise, a block encompassing much more than the portion comprising the local concentration may dilute the local concentration.

In one embodiment, frequently occurring text strings can be treated conceptually as individual symbols. During analysis 700, the data file is parsed into tokens to determine frequently occurring strings. Individual elements of a data file may be separated by delimiters; each delimited element, such as a word, may be treated as a token. Identical tokens may be tabulated to determine a relative occurrence of tokens. The most prevalent tokens may be assigned code symbols.

In on embodiment, additional compression techniques for combining alphabets in text strings into a single symbol may be used. Data may be compressed by searching text strings that have occurred in preceding text string and replacing the subsequent strings with a pair of numbers corresponding to the distance of the current position and the length of the repeated text string. Such a compressed data file may be further compressed using Huffman coding as described herein. In addition, an algorithm for Huffman coding may be employed whereby one encoding tree is applied to regular symbols and length values, and a second encoding tree is applied to distance values.

Once the data file is analyzed 700 and block sizes are determined, the data file is parsed 702 into blocks corresponding to the determined block sizes based on local symbol probabilities. The probabilities are used to produce 704 Huffman coding trees corresponding to each parsed portion of the data file, each Huffman coding tree assigning a symbol to each alphanumeric character in the parsed portion. In addition, each Huffman coding tree may include symbols associated with blocks of frequently occurring strings. Each Huffman coding tree is correlated 706 to the corresponding block. The Huffman coding trees are then used to encode 710 the blocks. The blocks can be distributed 708 to multiple processors or multiple cores of a multi-core processor. The encoded blocks are then transmitted 712 to a receiver/decoder. The transmitted blocks may comprise control bits to identify the type of data encoding, the encoding tree used to encode the data, and the encoded data.

In one embodiment, the encoder may determine that discontinuous portions of the data file use the same Huffman encoding tree, for example, with reference to a hash function of all utilized encoding trees. In that case, the encoder may package the discontinuous portions with tags to identify the intended locations of each block in the data file.

Figure 8:
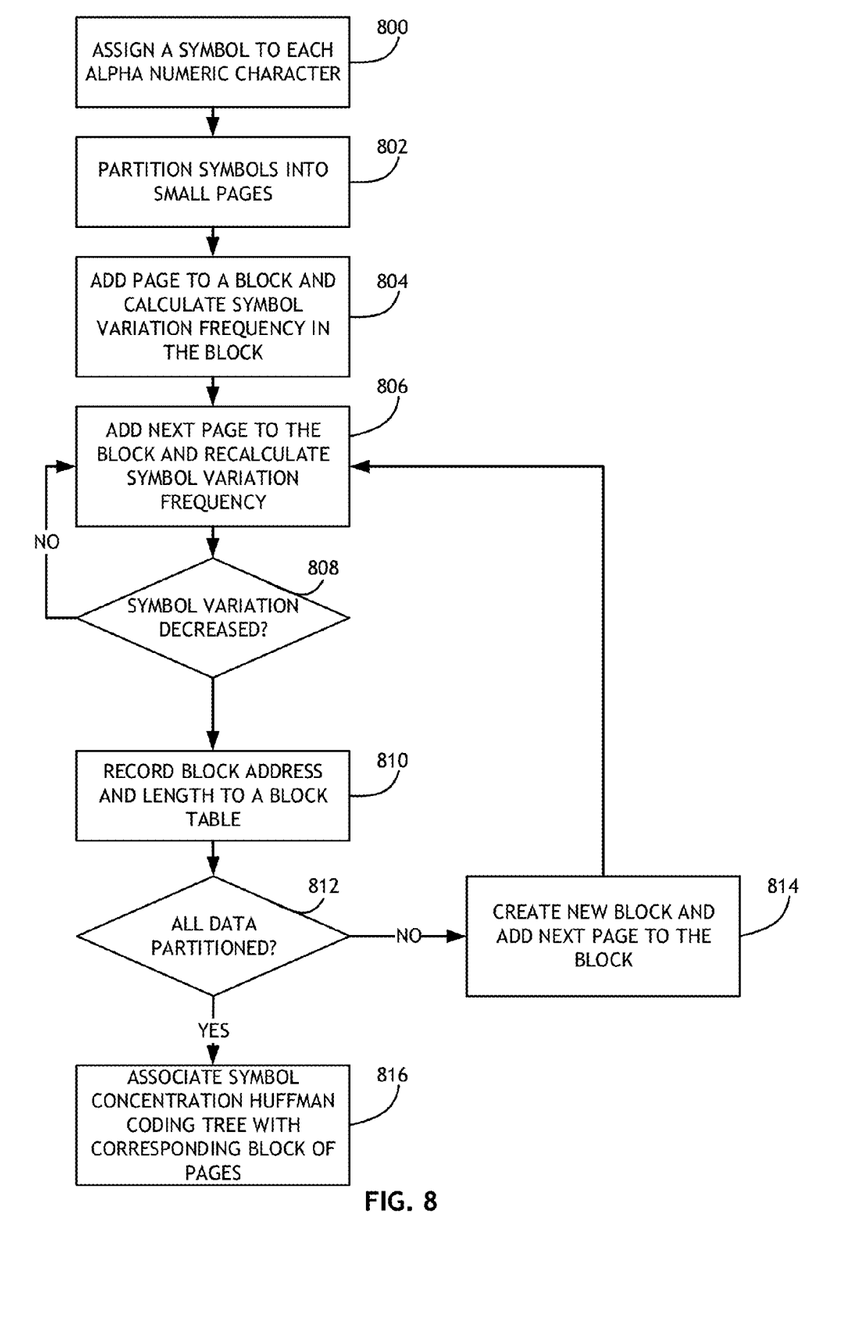
FIG. 8 is a flowchart of a method for determining symbol probabilities inventive concepts disclosed herein.

Referring to FIG. 8, a flowchart of a method for determining symbol probabilities inventive concepts disclosed herein is shown. In one embodiment, an encoder assigns 800 a symbol to each alphanumeric character in a data string. Symbols may represent symbols, keywords, or text string distance pairs, depending on the methodology for identifying long string of text. The encoder then partitions 802 the symbols into equally sized pages. Page size may be determined based on factors such as size of the file and processing time requirements. Smaller pages generally produce more accurate results.

The encoder instantiates a block and adds 804 a first page to the block. The encoder then calculates the disparity in symbol frequency in the block. Once the initial disparity in symbol frequency is calculated, the encoder iteratively adds 806 a next page and recalculates the disparity in symbol frequency. At each iteration, the encoder determines 808 if the disparity in symbol frequency decreases; if not, the encoder continues to add 806 the next page and recalculate the disparity in symbol frequency. The disparity is calculated by:

$$\frac{1}{N}\sqrt{\sum_{i=1}^{N}(a_i - E)}$$

where, $a_i$ is the i th symbol in the dictionary of the block, N is the total number of symbols in the block, and E is the average of number of occurrence of all symbols in the block.

If the disparity in symbol frequency decreases, the encoder records 810 the block address and block length in a block table. When a block is concluded, the encoder determines 812 if all data has been partitioned; if not, the encoder creates 814 a new block and repeats the process by adding 804 a first page and calculating the disparity in symbol frequency. If the encoder determines 812 that all data has been partitioned, the encoder associates 816 each block with a Huffman coding tree corresponding to the concentration of symbols in the block.

The encoder may define blocks including one or more pages with the size of a block corresponding to the number of pages in that block. The encoder identifies the number of consecutive pages allocated to a block such that the disparity in symbol frequency in each block is maximized; the larger the disparity, the more efficient the Huffman code.

Figure 9:
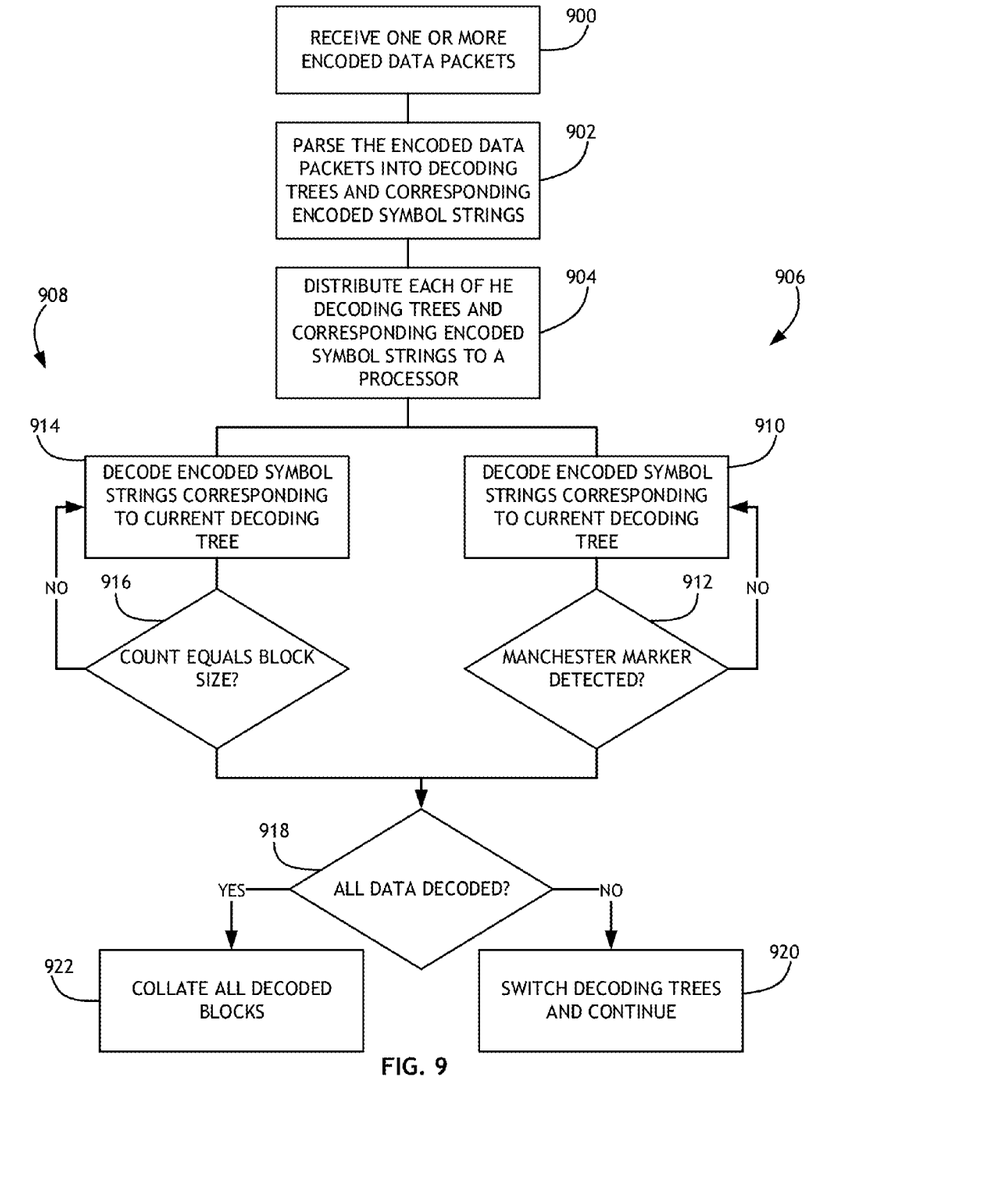
FIG. 9 is a flowchart of a method for decoding a data file according to one embodiment of the inventive concepts disclosed herein.

Referring to FIG. 9, a flowchart of a method for decoding a data file according to one embodiment of the inventive concepts of the present disclosure is shown. A decoder receives 900 encoded data packets. Each encoded data packet includes at least one block of encoded symbols, the Huffman code tree used to encode the encoded symbols, and may include a plurality of control bits. Alternatively, every Huffman coding tree may be sent independent and in advance of the encoded date packets.

The decoder parses 902 the encoded data packets to recover the Huffman coding trees corresponding to each encoded block and the encoded blocks themselves. In a multi-process system, or a system with multiple processing cores, the encoded blocks are distributed 904 to the processors or cores to produce a balanced workload.

Depending on the encoding methodology, the decoder may then employ either a Manchester code methodology 906 or a counting methodology 908 to decode the encoded blocks. In the Manchester code methodology 906, the decoder decodes 910 a first encoded symbol corresponding to a current decoding tree. The decoder then determines 912 if a Manchester marker has been detected; if not, the decoder continues to iteratively decode 910 subsequent symbols according to the current coding tree. If the decoder determines 912 that a Manchester marker has been detected, the decoder determines 918 if all data has been decoded; if not, decoder switches 920 to the next Huffman coding tree and continues decoding 910. If the decoder determines 918 that all data has been decoded, the decoded data is collated 922 such that block decoded in parallel are reassembled in the correct order.

In the counting methodology 908, the decoder decodes 914 a first encoded symbol corresponding to a current decoding tree. The decoder then determines 916 if the symbol count equals the block size; if not, the decoder continues to iteratively decode 914 subsequent symbols according to the current coding tree. If the decoder determines 916 that the symbol count equals the block size, the decoder determines 918 if all data has been decoded; if not, decoder switches 920 to the next Huffman coding tree and continues decoding 914. If the decoder determines 918 that all data has been decoded, the decoded data is collated 922 such that block decoded in parallel are reassembled in the correct order.

The encoded blocks are then decoded 906. In a multi-processor system, or a system with multiple processing cores, decoding 906 may be performed in parallel.

Figure 10:
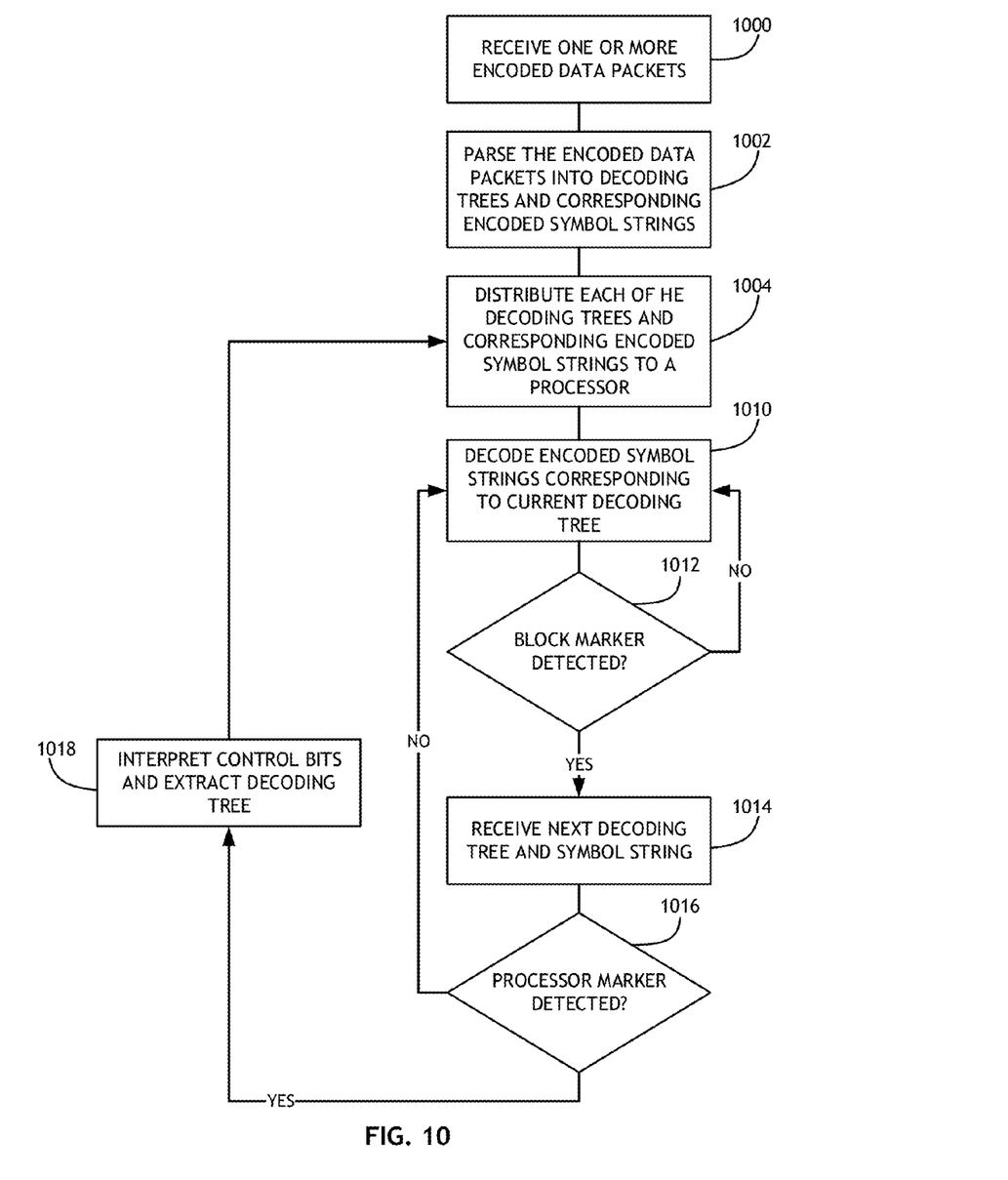
FIG. 10 is a flowchart of a method for decoding a data file according to one embodiment of the inventive concepts disclosed herein.

Referring to FIG. 10, a flowchart of a method for decoding a data file according to one embodiment of the inventive concepts disclosed herein is shown. A decoder receives 1000 encoded data packets. Each encoded data packet includes at least one block of encoded symbols, the Huffman code tree used to encode the encoded symbols, and may include a plurality of control bits. Alternatively, every Huffman coding tree may be sent independent and in advance of the encoded date packets.

The decoder parses 1002 the encoded data packets to recover the Huffman coding trees corresponding to each encoded block and the encoded blocks themselves. In a multi-process system, or a system with multiple processing cores, the encoded blocks are distributed 1004 to the processors or cores to produce a balanced workload.

The decoder decodes 1010 a first encoded symbol corresponding to a current decoding tree. The decoder then determines 1012 if a block marker has been detected; if not, the decoder continues to iteratively decode 1010 subsequent symbols according to the current coding tree. If the decoder determines 1012 that a block marker has been detected, the decoder receives 1014 the next Huffman coding tree and symbol string; that next Huffman coding tree then becomes the current coding tree. Alternatively, if all Huffman coding trees were sent in advance, the decoder switches to the next Huffman coding tree in the sequence, and that next Huffman coding tree becomes the current coding tree.

In a single processor, single core system, the decoder begins the processes of decoding 1010 the new symbol string. In a multi-processor or multi-core system, the decoder determines 1016 if a processor marker is detected; if not, the decoder continues to iteratively decode 1010 subsequent symbols according to the current coding tree. If a processor marker is detected, the decoder interprets 1018 control bits associated with the next Huffman coding tree and symbols string and distributes 1004 that next Huffman coding tree and symbol string to a processor according to a desirable load balancing scheme.

It is believed that embodiments of the inventive concepts disclosed herein and many of their attendant advantages will be understood by the foregoing description of embodiments of the inventive concepts disclosed herein, and it will be apparent that various changes may be made in the form, construction, and arrangement of the components thereof without departing from the broad scope of the inventive concepts disclosed herein or without sacrificing all of their material advantages. The form herein before described being merely an explanatory embodiment thereof, it is the intention of the following claims to encompass and include such changes.

What is claimed is:

1. A computer system for encoding a data file, comprising:
   at least one processor coupled with a non-transitory processor-readable medium storing processor executable code for causing the at least one processor to:
      analyze a data file to identify a first portion of the data file having a first symbol probability and a second portion of the data file having a second symbol probability;
      produce a first coding tree corresponding to the first symbol probability and a second coding tree corresponding to the second symbol probability;
      encode the first portion using the first coding tree; and
      encode the second portion using the second coding tree; and
      transmit the encoded data file.

2. The computer system of claim 1, wherein:
   the at least one processor comprises at least two cores; and
   wherein encoding the first portion is performed by a first core of the at least two cores; and
   encoding the second portion is performed by a second core of the at least two cores.

3. The computer system of claim 1, wherein analyzing the data file further comprises:
   parsing the data file into a plurality of pages;
   tabulating a first frequency of each symbol in a first page of the plurality of pages;
   tabulating a second frequency of each symbol in the first page and a second page of the plurality of pages; and
   determining whether the second frequency represents an increased disparity in symbol frequencies as compared to the first frequency.

4. The computer system of claim 3, wherein analyzing the data file further comprises:
   iteratively tabulating new frequencies of each symbol in an increasing set of pages until the new frequencies indicate a decreasing disparity; and
   recording a block size corresponding to a number of pages in the set of pages.

5. The computer system of claim 1, wherein analyzing the data file further comprises:
   identifying repeated symbol strings; and
   assigning a symbol value to the repeated symbol strings.

6. The computer system of claim 5, wherein the non-transitory processor-readable medium further stores processor-executable code for causing the at least one processor to include a block switching element between the first block and the second block.

7. The computer system of claim 5, further comprising a decoder, the decoder configured to:
   analyze the encoded data file to identify the first block and the second block;
   assign the first block to a first decoding core for decoding; and
   assign the second block to a second decoding core for decoding.

8. The computer system of claim 1, wherein the non-transitory processor-readable medium further stores processor-executable code for causing the at least one processor to generate an encoded data file having a first block comprising the first coding tree and first encoded portion, and a second block comprising the second coding tree and second encoded portion and transmit the encoded data file.

9. A method for encoding data comprising:
   analyzing a data file with a processor to identify a first portion of the data file having a first symbol probability and a second portion of the data file having a second symbol probability;
   producing a first coding tree, with a processor, corresponding to the first symbol probability and a second coding tree corresponding to the second symbol probability;
   encoding the first portion, with a processor, using the first coding tree; and
   encoding the second portion, with a processor, using the second coding tree.

10. The method of claim 9, wherein:
    encoding the first portion is performed by a first processor; and
    encoding the second portion is performed by a second processor.

11. The method of claim 9, wherein analyzing the data file comprises:
    parsing the data file into a plurality of pages;
    tabulating a first frequency of each symbol in a first page of the plurality of pages;
    tabulating a second frequency of each symbol in the first page and a second page of the plurality of pages; and
    determining that the second frequency represents an increased disparity in symbol frequencies as compared to the first frequency.

12. The method of claim 11, wherein analyzing the data file further comprises:
    iteratively tabulating new frequencies of each symbol in an increasing set of pages until the new frequencies indicate a decreasing disparity; and
    recording a block size corresponding to a number of pages in the set of pages.

13. The method of claim 12, wherein analyzing the data file further comprises:
    identifying repeated symbol strings; and
    assigning a symbol value to the repeated symbol strings.

14. The method of claim 13, further comprising including a block switching element between the first block and the second block.

15. The method of claim 9, further comprising producing an encoded data file having a first block comprising the first coding tree and first encoded first portion, and a second block comprising the second coding tree and second encoded portion.

16. A computer system for decoding encoded data comprising:
    at least one processor;
    memory connected to the at least one processor, the memory configured to store processor executable code;
    processor executable code,
    wherein the processor executable code configures the processor to:

receive a data file comprising a first encoded block and a second encoded block;

recover a first coding tree from the first block corresponding to a first symbol probability and a second coding tree from the second block corresponding to a second symbol probability;

decode the first block using the first coding tree;

decode the second block using the second coding tree; and produce a decoded data file.

17. The computer system of claim 16, wherein:

the at least one processor comprises at least two cores;

decoding the first block is performed by a first core of the at least two cores; and decoding the second block is performed by a second core of the at least two cores.

18. The computer system of claim 17, wherein decoding the first block and decoding the second block are performed in parallel.

19. The computer system of claim 18, wherein the non-transitory processor-readable medium further stores processor-executable for causing the at least one processor to:

include a first core identification code in an output from the first core;

include a second core identification code in an output from the second core; and correlate the first output from the first core and the second output from the second core based on the first core identification code and the second core identification code.

20. The computer system of claim 18, wherein the non-transitory processor-readable medium further stores processor-executable code for causing the at least one processor to identify a plurality of control bits in each of the first block and second block, the plurality of control bits configured to identify at least one of Huffman encoded symbols or repeated symbol strings in the first block and second bloc.

* * * * *